United States Patent
Walker, Jr. et al.

(10) Patent No.: US 8,099,263 B2
(45) Date of Patent: Jan. 17, 2012

(54) SYSTEM AND METHOD FOR CUSTOM PRODUCT DESIGN

(75) Inventors: Kenneth A. Walker, Jr., Somerville, MA (US); Vyacheslav Nykyforov, Waltham, MA (US)

(73) Assignee: Vista Print Technologies Limited, Hamilton (BM)

( * ) Notice: Subject to any disclaimer, the term of this patent is extended or adjusted under 35 U.S.C. 154(b) by 2446 days.

(21) Appl. No.: 10/748,364

(22) Filed: Dec. 30, 2003

(65) Prior Publication Data

US 2005/0147442 A1    Jul. 7, 2005

(51) Int. Cl.
  *G06G 7/48* (2006.01)
(52) U.S. Cl. .......................................................... 703/6
(58) Field of Classification Search ........................ 703/6
  See application file for complete search history.

(56) References Cited

U.S. PATENT DOCUMENTS

| | | | |
|---|---|---|---|
| 5,930,810 A | 7/1999 | Farros et al. | |
| 6,572,149 B2 * | 6/2003 | Long | 283/51 |
| 7,107,285 B2 * | 9/2006 | von Kaenel et al. | 707/104.1 |
| 2002/0067500 A1 | 6/2002 | Yokomizo et al. | |
| 2003/0160819 A1 | 8/2003 | Chase | |
| 2003/0182402 A1 | 9/2003 | Goodman et al. | |
| 2004/0023190 A1 | 2/2004 | Rowles | |

* cited by examiner

Primary Examiner — Hugh Jones
(74) Attorney, Agent, or Firm — Jessica J. Costa

(57) ABSTRACT

Computer-implemented electronic document design systems and methods allowing a user to integrate user-specific location maps into custom printed products. During the creation of an electronic design of a product intended for subsequent printing, user-provided location information is received by a server computer and used to generate a user map suitable for high quality printing. Lower resolution display and thumbnail versions of the map suitable for displaying to the user of the client system are generated. The display version is sent to the client system for review and editing by the user. The user map, the display map, and the thumbnail are stored at the server for possible future use. The maps are created and stored with the same height to width ratio as the map area in the electronic product design into which the map will be placed. The user is provided with a cropping tool to allow the user to select the portion of the map to be incorporated into the electronic product design.

32 Claims, 7 Drawing Sheets

SYSTEM AND METHOD FOR CUSTOM PRODUCT DESIGN

FIELD OF THE INVENTION

The present invention relates generally to computer-implemented automated electronic product design.

BACKGROUND OF THE INVENTION

Many individuals, businesses, and organizations occasionally have a need for custom printed materials, such as business cards, party invitations, product or service brochures, promotional postcards, or any number of other items. Some of these individuals and businesses turn to sources such as a local print shop for assistance in preparing the materials. Others may attempt to create the product themselves using specialized software purchased and installed on a personal computer to design the product and using their local printer attached to their personal computer to perform the printing.

An increasingly popular alternative for obtaining these types of materials is the use of a Web-based printing service provider that takes advantage of the capabilities of the Web and modern Web browsers to provide document design services from any computer with Web access at whatever time and place is convenient to the user. Computerized systems typically provide their customers with the ability to access and view a wide range of pre-designed product templates, select a desired template, and enter information to create a customized product design. Typically, a user can add, modify, and position custom text and upload images to be added to the electronic product design. When a user is satisfied with the design of the product, the user can place an order with the printing service provider for the production of a desired quantity of high quality printed versions of the product to be delivered to the customer's home or business.

In another computer-related field, high quality mapping software is available from various vendors either online or on a CD or other media and mapping software applications have become common. Examples include mobile applications, like handheld and automotive map systems using global positioning technology, and commercial establishment applications, such as customized driving maps printed at car rental offices for individual customers. In the Web environment, various free services available on the Web, such as MapQuest.com and Yahoo.com, allow an individual to enter a street address and view a corresponding map. Tools to modify the displayed map by zooming or scrolling are also commonly provided. Businesses maintaining Web sites frequently incorporate access to a mapping service to display maps for stores and custom driving directions from an address entered by the user.

Printed business and promotional materials incorporating a map depicting the location of an office or a special event can provide an edge in a competitive business environment and be of significant value in assisting new and infrequent customers. There is, therefore, a need for an improved electronic product customization system that allows a user of a Web-based product design system to easily incorporate a high resolution customized map into a product design intended for subsequent printing.

SUMMARY

The present invention is directed to satisfying the need for computer implemented systems and methods providing improved electronic product design tools that allow a user increased ability to select and control the colors used in a product being designed.

In accordance with the invention, in response to information identifying at least a location and received by a server from a user of a client computer system, the server makes a request for a high resolution map for that identified location. A lower resolution display map version is generated by the server from the high resolution map and transmitted to the client computer for viewing by a user engaged in creating an electronic product design at the client system. The user can incorporate at least a portion of the map into the electronic product design. The description of the electronic product design supplied from the client to the server identifies the portion of the map incorporated into the design by the user. A high resolution version of the identified map portion is associated with the electronic product design such that, when the product is subsequently printed, the map will be printed using the high resolution image.

It is an advantage of the invention that a custom map for a location specific to the user can be readily incorporated into the electronic design of a product.

Other objects, features, and advantages of the invention will be better understood with reference to the accompanying drawings, description, and claims.

DETAILED DESCRIPTION

Figure 1:
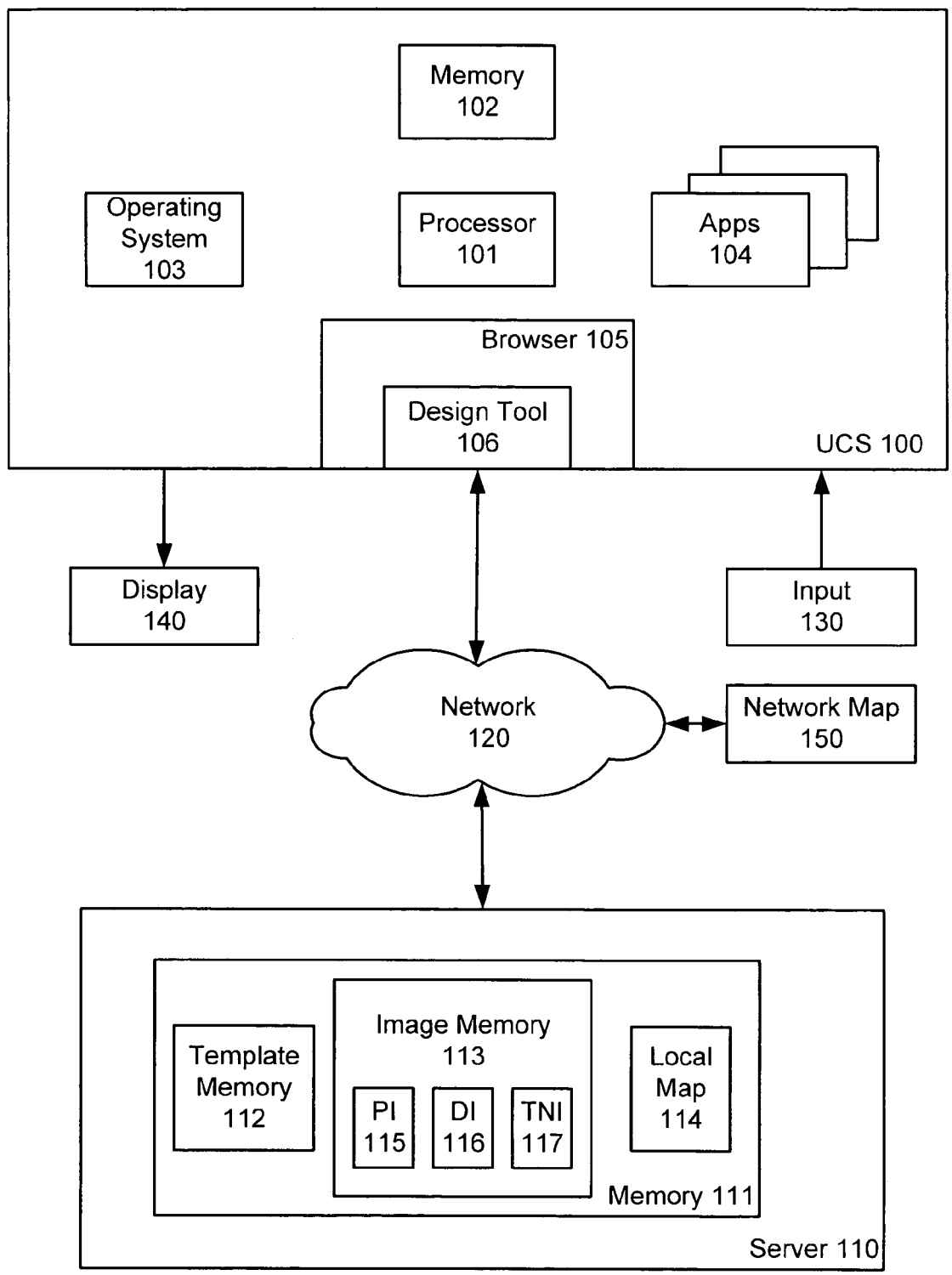
FIG. 1 is a block diagram of a computer system with which the invention may be employed.

Referring to FIG. 1, an exemplary user computer system UCS 100 includes processor 101 and memory 102. Memory 102 represents all UCS 100 components and subsystems that provide data storage, such as RAM, ROM, and hard drives. In addition to providing permanent storage for all programs installed on UCS 100, memory 102 also provides temporary storage required by the operating system and the applications while they are executing. In a preferred embodiment, UCS 100 is a typically equipped personal computer, but UCS 100 could also be a portable computer, a tablet computer, or other device. The user views images from UCS 100 on display 140, such as a CRT or LCD screen, and provides inputs to UCS 100 via input devices 150, such as a keyboard and a mouse.

When UCS 100 is operating, an instance of the USC 100 operating system will be running, represented in FIG. 1 by operating system 103. In addition, the user may be running one or more application programs. In FIG. 1, UCS 100 is running Web browser 105, such as Internet Explorer from Microsoft Corporation. Other applications that may be running in USC 100, such as spreadsheet, e-mail, and presentation programs, are represented as applications 104. In the depicted embodiment, design tool 106 is a product design program downloaded to UCS 100 via network 120 from remote server 110, such as downloadable design tools provided by VistaPrint Limited and publicly available at vistaprint.com. Design tool 106 runs in browser 105 and allows the user to prepare a customized product design in electronic form. Alternatively, design tool 106 could have been obtained by the user from memory 102 or from another local source. When the customer is satisfied with the design of the product, the design can be uploaded to server 110 for storage and, if desired by the user, subsequent production of the desired quantity of the physical product on appropriate printing and post-print processing systems. While server 110 is shown in FIG. 1 as a single block, it will be understood that server 110 could be multiple servers configured to communicate and operate cooperatively.

Memory 111 represents all components and subsystems that provide server data storage, such as RAM, ROM, and disk drives or arrays. Template memory 112 contains the layout information provided by the service provider to enable the creation and rendering of electronic product design templates at UCS 100. As used in this embodiment, a layout is an XML (extensible markup language) and VML (vector markup language) description that specifies the size, position, z-index, and other attributes of all product elements such as text containers, image containers, graphics, default fonts, default colors, and so forth. Technical details of XML and VML are publicly available from the World Wide Web Consortium at www.w3c.org. While the embodiment of the invention disclosed herein describes the use of XML and VML, it will be understood that other languages could be employed.

Image memory 113 represents the portion of memory 111 that contains the image content information and related attributes used in combination with the layouts to generate various product designs. In the embodiment discussed herein, image memory 113 will also contain multiple versions of any map or maps requested by the user. For the purpose of this discussion, the portions of memory 113 devoted to storing the map versions are identified as print image memory PI 115, display image memory DI 116, and thumbnail image memory TNI 117, but it will be understood that these are logical memory divisions and need not be physically separate memory areas.

This flexible template structure mentioned above allows the service provider to combine layouts and images to assemble custom templates in response to user inputs, such as keywords or other user preferences, and allows the user to select and modify or replace individual template components. Co-pending and co-owned U.S. application Ser. No. 10/646, 554 entitled "Automated Image Resizing and Cropping", filed Aug. 22, 2003, the complete contents of which are hereby incorporated by reference into this application, discloses electronic product creation and editing systems for combining separately stored content and layouts to create custom product designs.

Local map 114 is a commercially available mapping software program, for example MapPoint from Microsoft Corporation. Having the mapping software available at server 110 allows for rapid access to relatively high resolution map data so that the display image version of the map can be returned to UCS 100 for viewing without excessive delays. As an alternate embodiment, if performance requirements can be satisfied and adequate data transfer capacity is available, remotely located mapping software Network Map 150 could be employed.

Figure 2:
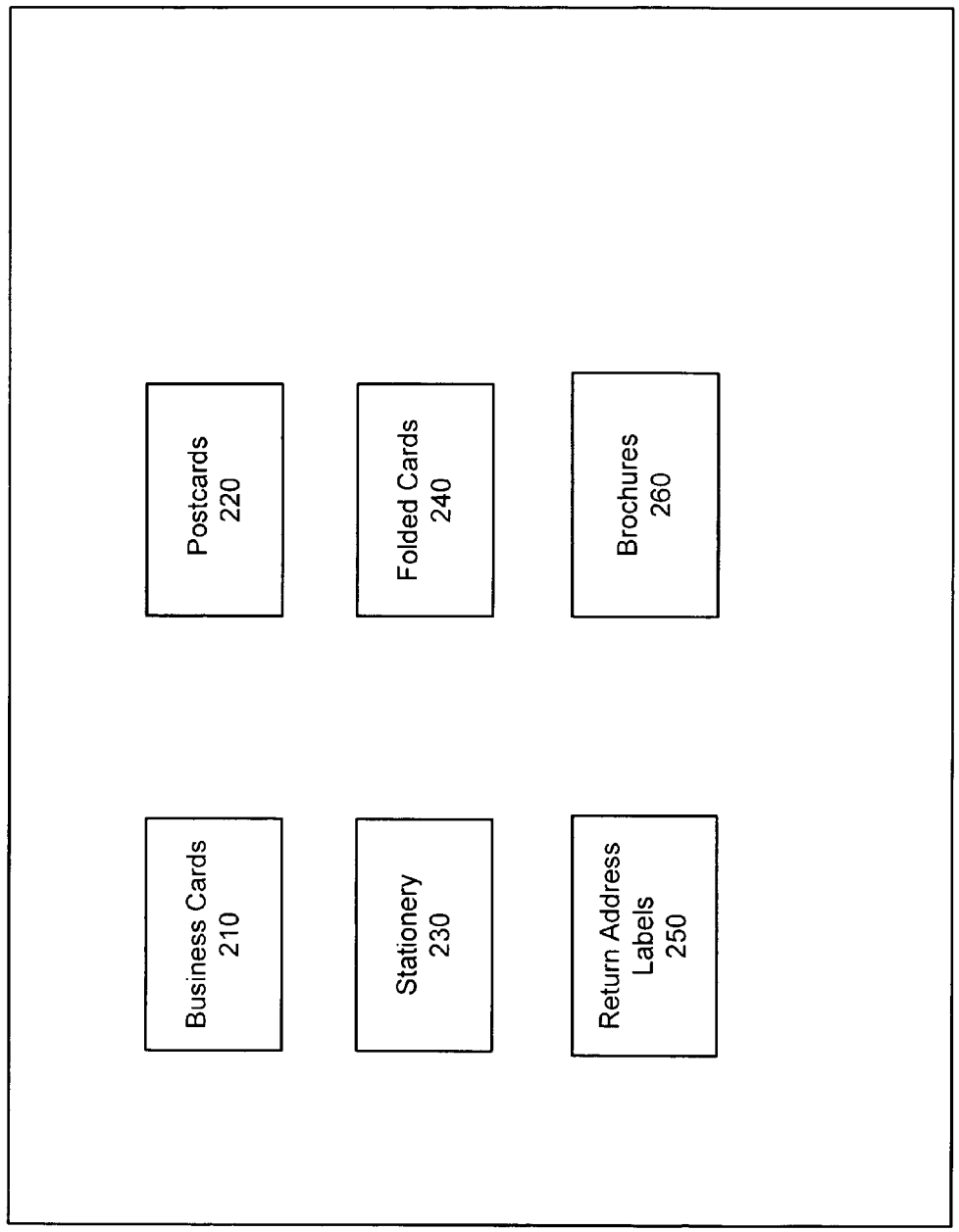
FIG. 2 is a representation of a product selection display presented to a user engaged in designing an electronic document.

FIG. 2 is a simplified representation of an introductory product selection page being viewed by the user of UCS 100 on user display 140. In this example, the page displays and promotes various products available from the service provider and offers active controls that allow the user of UCS 100 to select a desired type of product for a more detailed presentation of design options. By way of example, FIG. 2 shows promotional images for business cards 210, postcards 220, stationery 230, folded cards 240, return address labels 250, and brochures 260. Images or promotions for fewer, different or additional products, such as presentation folders, invitations, announcements, thank you cards, gift tags, and so forth could also be presented along with other information and buttons. It will be understood that the invention is not limited to documents that are intended for eventual printing on paper, but could as well be readily adapted to a wide range of products that a user may wish to customize, such as items of clothing, product containers, promotional goods, and so forth.

As an illustrative example, it will be assumed that the user of UCS 100 desires to create a personalized business card and, therefore, selects the business card option, for example by clicking with the user's mouse cursor on the business cards 210 image. The user is then presented with one or more additional selection screens, not shown, from which the user can review the various business card categories organized, for example, by industry or general style. When a desired category is selected, the user can review one or more pages of thumbnail images of pre-designed business card templates prepared by the service provider. As an alternative to providing a large gallery of thumbnail template images for the user to scan, the service provider could provide a keyword searching tool to allow the service provider to display only thumbnails of templates with images or other content corresponding to the user's search terms. Each template will contain a different combination of features, such as colors, textures, images, fonts, and text arrangements.

Figure 3:
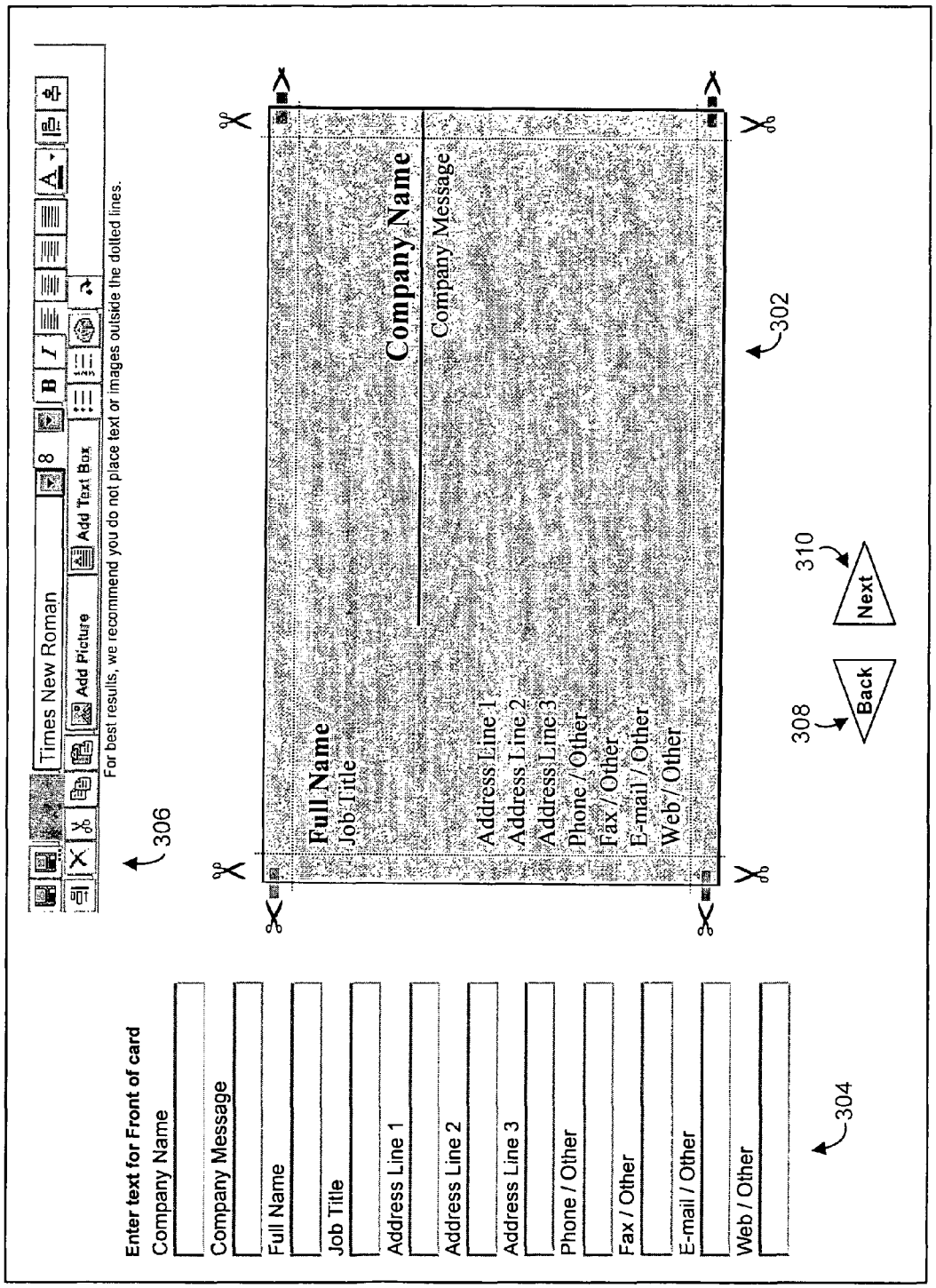
FIG. 3 is a representation of a user display for customizing the front side of a product.

Referring to FIG. 3, when the user selects a specific business card thumbnail image that the user desires to customize, server 110 responds to the selection by downloading the corresponding layout and content information to UCS 100. Design tool 106 receives the layout and content information and generates a customizable template image 302 of the selected product design.

In the example shown in FIG. 3, template 302 represents one side of a business card being designed by a user. The printing service provider has incorporated placeholder text in a default font in the design to give the user a visual indication of how and where the user's corresponding information would appear on the finished card. The initial template 302 is the starting point for the user's customized product design.

As shown in FIG. 3, the service provider has supplied the user with two tools for allowing the user to enter the user's custom text. One tool is a set of labeled text fields 304 into which the user can type the user's information. As the user types in each box, the corresponding placeholder text in template 302 is replaced with the text entered by the user in the box. Unwanted text fields can be deleted from template 302, for example by placing an empty space in the corresponding text box.

Each of the text fields shown in template 302, such as "Full Name" or "Address Line 1", is a separate markup language text box pre-designed and positioned by the template designer. Each text box can be individually modified or repositioned. For users desiring to change fonts or font attributes, move text, or perform other customizing actions beyond merely entering text using the default font, edit tool bar 306 is provided. Edit Tool Bar 306 contains various buttons, controls, and menus allowing the user to add additional text boxes, insert text, change the font, change font attributes, and perform other typical editing actions. Text boxes and the techniques for designing and using edit tool bars are well known in the art.

It is not necessary that both edit tool bar 306 and text boxes 304 are provided to a user and, if both are provided, it is not necessary that they be provided simultaneously. A service provider could opt to provide only a single tool or, depending on the level of customizing capabilities the service provider desires to give to the user, the service provider may also choose to provide the user with one or more additional instructions, tools, or controls, not shown, to facilitate user editing of template 300, such as tools for changing the template layout, the design effects, or the font scheme. Co-pending and co-owned U.S. application Ser. No. 10/449,836 entitled "Electronic Document Modification", filed May 20, 2003, the complete contents of which are hereby incorporated by reference into this application, describes a document editing system and method using separately selectable layouts, designs, color schemes and font schemes.

Navigation buttons back 308 and next 310 allow the user to move back to the previous display screen or ahead to the next. Different or additional navigation means could also be employed. When the user has entered the user's information for the business card and performed any other desired editing operations, the user can proceed to edit the backside of the card by clicking next button 310.

Figure 4:
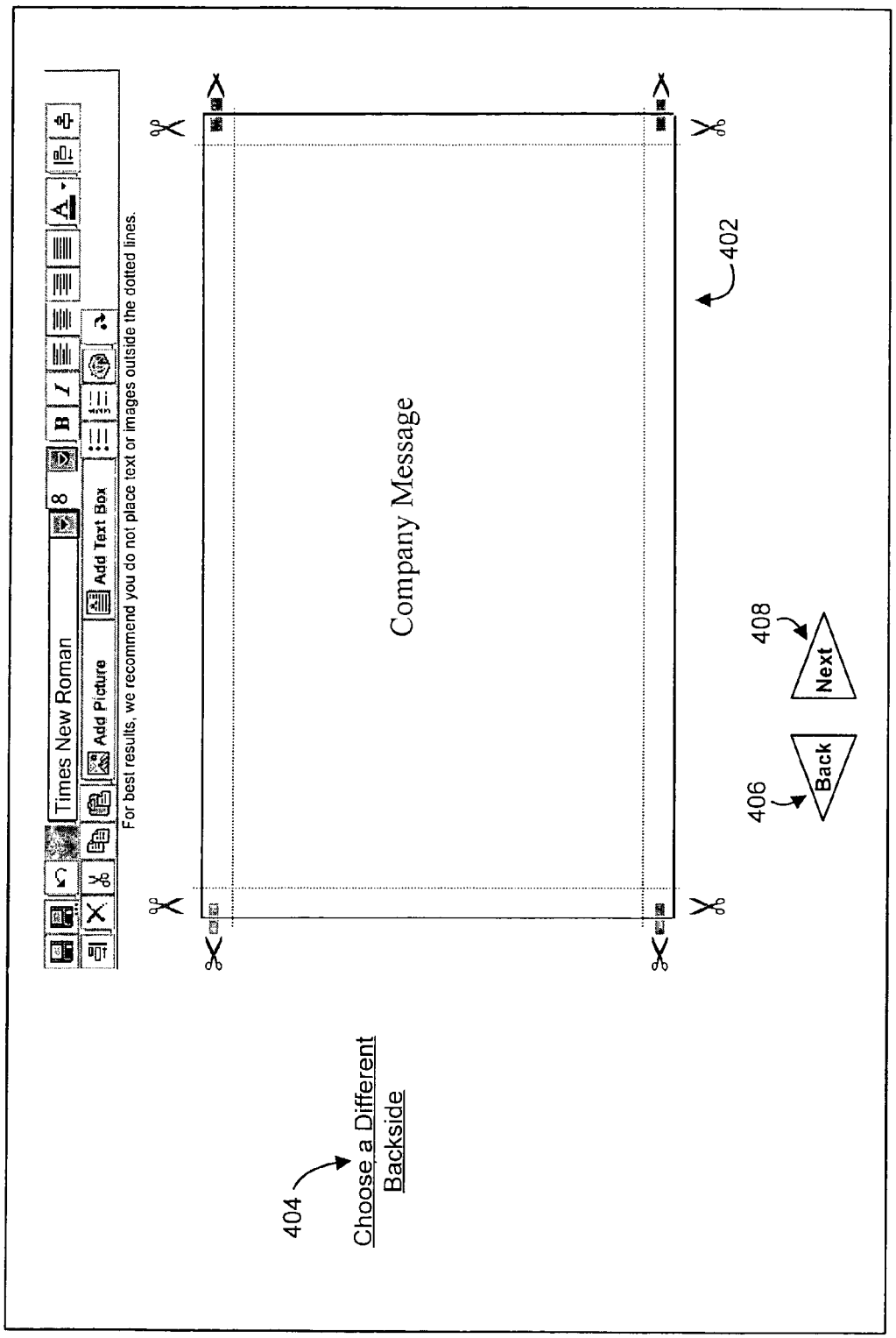
FIG. 4 is a representation of a user display for customizing the backside of the product.

Referring to FIG. 4, the user is presented with business card backside template 402. The default backside template in this example has been pre-filled by the template designer with a placeholder text line suggesting that the user may wish to place the user's company message on the backside of the card. Other alternate default backsides could be employed. The user has the option of choosing another backside, as discussed below, or of editing the current backside using edit tool bar 306 or other editing tools that the service provider may choose to make available.

Figure 5:
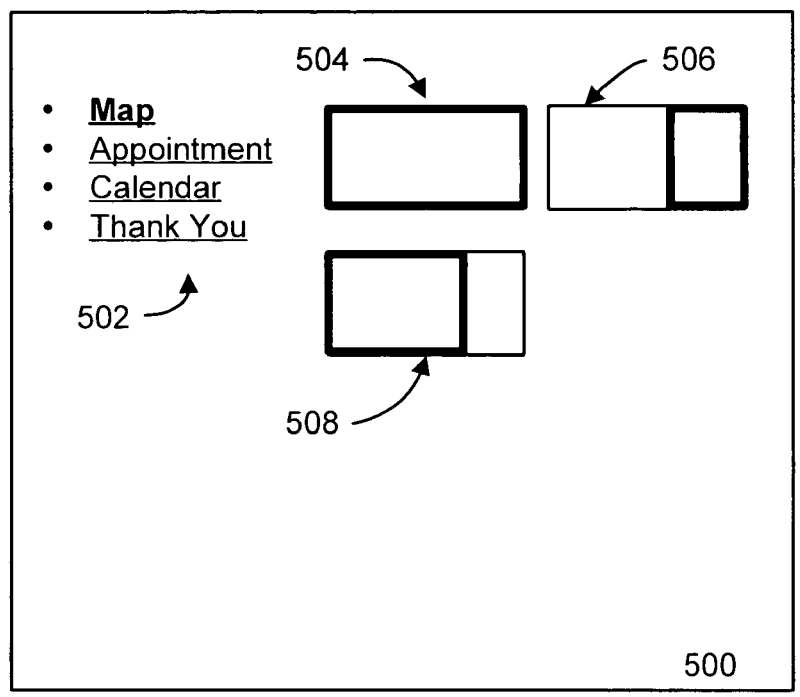
FIG. 5 is a representation of a user display for selecting a map option for the backside of the product.

To provide the user with the flexibility to select an appropriate backside of the card, the service provider makes various other backside templates available. In the disclosed embodiment, the user accesses the alternate backside choices by clicking on text button 404. Referring to FIG. 5, in response to selection of text button 404, backside selection window 500 is displayed to the user. Because numerous alternate backsides are provided, the alternate backsides have been divided by the service provider for user convenience into categories such as maps, appointments, calendars, and thank you messages. More or fewer categories could be offered. Each category of backside has an associated text button 502. In this example, the initially selected category is maps, indicated by the map text button being displayed in bold. The user can view other available alternate backside templates by clicking on the appropriate text button 502.

In the category of maps, three different backside thumbnail images 504, 506 and 508 are displayed for the user's review. The portion of the backside template that will be occupied by a map is indicated in FIG. 5 by bold outlining. For example, in template 504, the entire backside of the card will be covered by a map. In template 506, the right side of the backside would be a map while the remainder would be available for text or other content. Template 508 shows another variation with the map occupying most of the backside and a relatively small area available for text.

Figure 6:
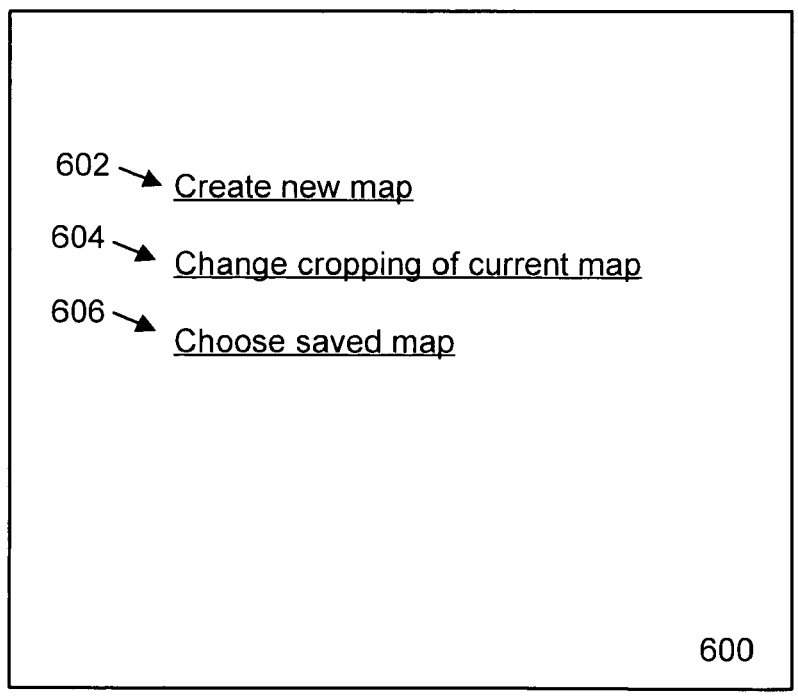
FIG. 6 is a representation of a user display for selecting a map operation.

When the user clicks on the thumbnail of the desired backside map template, the user is presented with map function window 600, as shown in FIG. 6. Window 600 presents the user with three text button options: create new map 602, change cropping of current map 604, and choose saved map 606. If the user selects create new map 602, the user is presented with address and zoom window 700.

Figure 7:
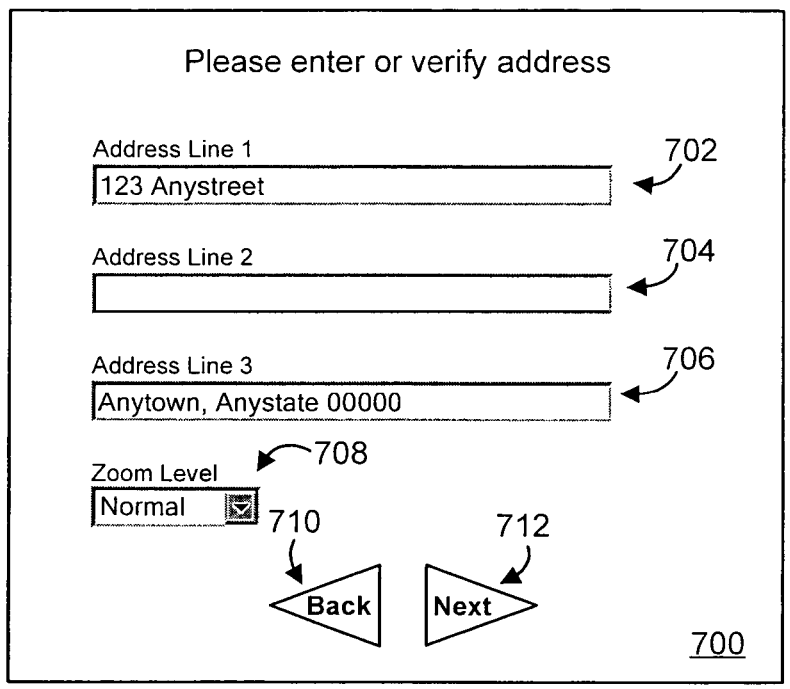
FIG. 7 is a representation of a user display for entering a mapping address.

Referring to FIG. 7, address and zoom window 700 contains three address lines 702, 704 and 706. In the business card example shown in FIG. 3, the three address lines in window 700 correspond to the three similarly labeled address lines in template 302. To assist the user, the three address fields will be pre-filled to contain the address information previously entered by the user during user editing of the front side of the business card. For illustration, FIG. 7 indicates the appearance of the address lines if the user had entered "123 Anystreet" in the Address Line 1 field of template 302, left Address Line 2 blank, and entered "Anytown, Anystate 00000" in Address Line 3 field of template 302. For other types of products where address information has not been earlier provided, address fields 702, 704 and 706 will be initially empty.

In the disclosed embodiment, zoom level drop down menu 708 is provided to allow the user to select among different zoom levels. The zoom level is initially set to a predetermined default level selected by the service provider and called "normal". The "normal" level can be set by the service provider to any desired value that is supported by local map 114. At this point, the user can continue with generating a custom map at the default zoom level using the pre-filled address information by clicking next button 712 or can modify the displayed address or the zoom level as desired before proceeding with map generation.

When the user clicks next 712, design tool 106 sends the address line contents and zoom level information to server 110 together with map container information. The map container information could be, for example, the height and width of the map container in the template or a container identifier established by the service provider that enables the server to determine the height to width ratio of the map image container. At server 110, the server structures a map request to local map 114 using the address and the zoom level. The map request is also structured such that the resulting map returned by local map 114 will have sufficient information to provide a printable image of high quality, typically 300 dots per inch or greater, when the map image is placed in the template map container and will have a height to width ratio that is substantially the same as the height to width ratio of the map container in the template.

If local map 114 is unable to recognize the supplied information as a valid address, local map 114 will return an error message to server 110 which will notify design tool 106 and cause a user message, not shown, to be displayed, such as "Could not generate map. Please make sure the address below is correct". The user can then review and make any required corrections to the address in address fields 702, 704 and 706 or, if the address is correct and a map is for some reason not available, the user can return to the display of FIG. 5 and select another type of backside template.

If a map corresponding to the submitted address is successfully returned by local map 114, the returned map is stored by server 110 in print image memory 115 as a high resolution map version to be used as the source of the product map during subsequent printing of the product. A lower resolution version of the map suitable for displaying to the user, typically at 72 dpi, is generated by server 110 from the returned user map and transmitted to UCS 100. The lower resolution version is stored in image memory 113 in display image memory 116 for possible future use. A smaller thumbnail version of the map is also created and stored in thumbnail image memory 117 for possible future use, as discussed below.

Figure 8:
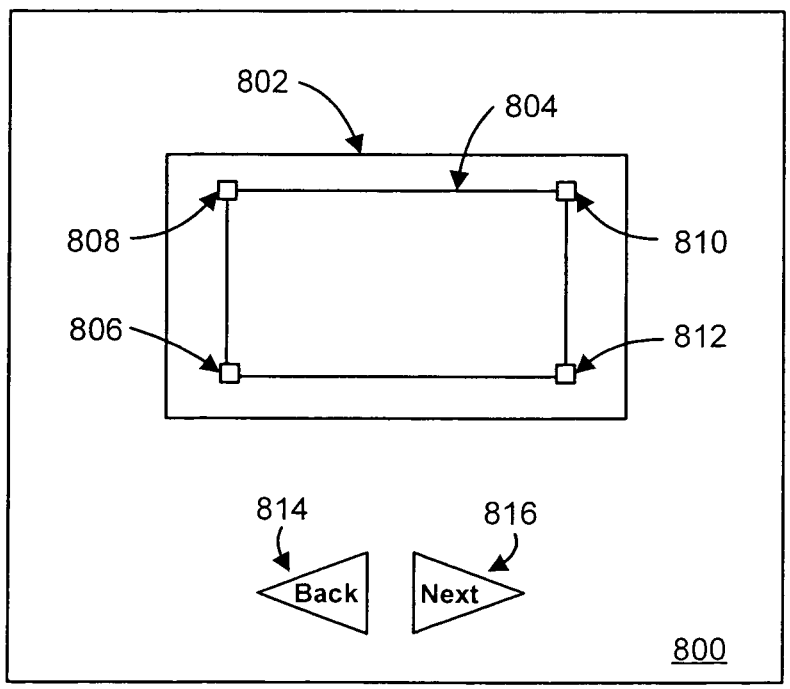
FIG. 8 is a representation of a user display for changing the cropping of a map.

Referring now to FIG. 8, if a map is successfully obtained for the submitted address information, cropping window 800 is provided to the user. The display version of the returned map is displayed to the user as map image 802. FIG. 8 shows the situation where the user selected thumbnail 504 having the entire side of the card covered by a map. Image 802, therefore, is generated to have the same height to width ratio as the image area of the backside template selected by the user. If the user had chosen backside template 506, image presented in cropping window 800 would have the height to width ratio of the map area indicated by bold lines. While not shown in FIG. 8, it will be understood that image 802 will typically be a street map of the vicinity of the supplied address. The level of detail displayed will vary depending on the zoom level selected.

Crop box 804 is displayed over image 802. The operation of crop boxes is well known. The portion of image 802 inside of crop box 804 will be the portion of the map image that will be incorporated into template 402. As a default, the crop box is initially established to be smaller than the total available map 502. The user can reposition the crop box by positioning the user's mouse over the crop box and executing a drag-and-drop operation. The user can also, if desired, resize crop box 804 by using the mouse to grab one of the four resizing handles 806, 808, 810 and 812 located at the corners of the box and dragging the handle in a substantially diagonal motion to either enlarge or reduce the box size. The height to width ratio of crop box 804 is locked by the system to be the same as the map area of the selected backside template. The user can resize the box using the corner handles, but, regardless of the manner in which the user attempts to move the user's mouse, any resizing will be constrained by the system to maintain a constant height to width ratio. Co-pending and co-owned application Ser. No. 10/713,446 entitled "Image Cropping System and Method", which is hereby incorporated by reference in its entirety, discloses crop boxes having locked height to width ratios that correspond to the height and width ratio of the associated image area in a product template.

The user can repeat repositioning and resizing operations as often as desired until the desired portion of image 802 is inside of box 804. If the user desires to change the zoom level of image 802, the user can select back button 814, return to FIG. 7, select another zoom level using zoom level 708 and select next button 712. As discussed above, selection of button 712 will generate a new map request. The address and zoom level will be transmitted to server 110 and the other steps discussed above in connection with FIG. 7 will be repeated, including the creation and storage in image memory 113 of a new print image, display image and thumbnail image associated with the new zoom level map. The user can repeat zoom level changes as often as desired until a satisfactory zoom level is obtained. The service provider can opt to retain all different zoom level images tried by a user in image memory 113 or to retain only the most recent zoom level version.

When the user is satisfied with the zoom level and the portion of image 802 contained in crop box 804, the user can select next button 816. This return the user to the backside editing screen depicted in FIG. 4. The portion of map image 802 contained in crop box 804 at the time next button 816 was selected will be displayed to the user in template 402.

If the user desires to change the backside again, the user can select choose a different backside button 404 to cause window 500 to be displayed or can position the mouse cursor over the map area of template 402 and double click. Executing a double click operation while positioned over the map area will cause map options window 600 to be displayed again. As mentioned above, window 600 offers the user three options. If the user selects create new map 602, the map generation process will repeat as discussed above in connection with FIGS. 7 and 8. If the user selects change cropping of current map 604, cropping window 800 will be displayed with crop box 804 positioned to indicate the current cropped portion of image 802 appearing in the map area of template 402. The user can then reposition or resize the crop box as desired. If the user selects choose saved map 606, design tool 106 requests all thumbnail map images stored in thumbnail memory 117 associated with this user. The map thumbnails are transferred to UCS 100 and displayed in saved map window 900.

Figure 9:
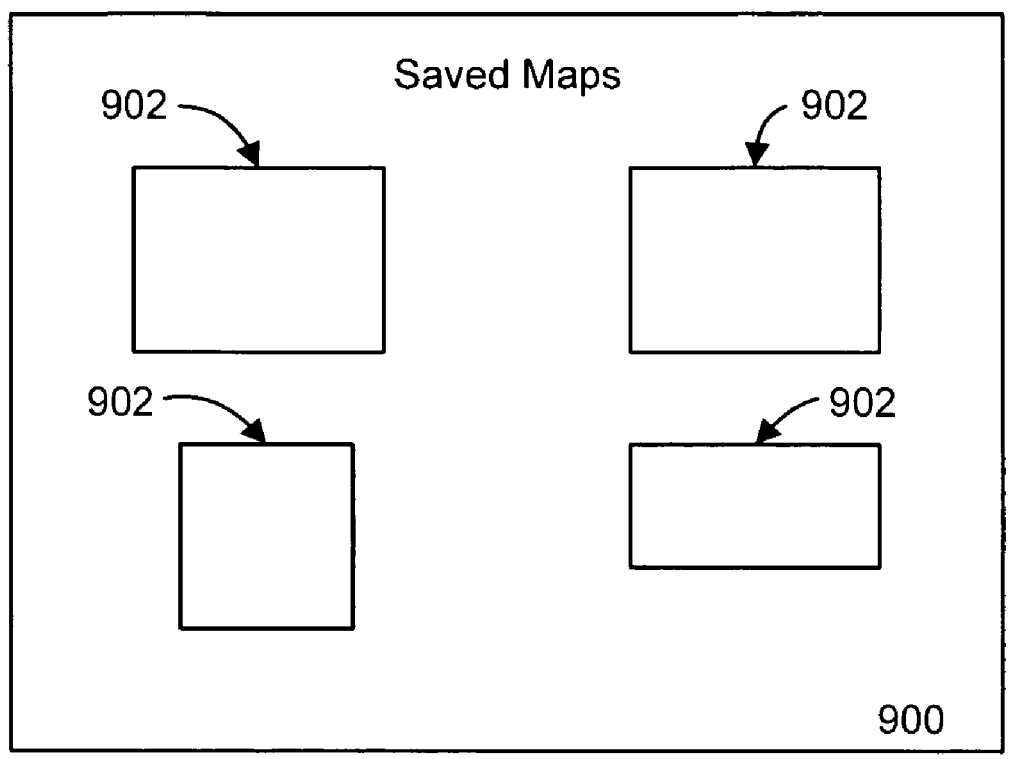
FIG. 9 is a representation of a user display for selecting a stored map image.

As indicated in FIG. 9, the saved maps could have a variety of different shapes depending on the shape of the image container in the product template for which the map was originally sized. If the user selects one of the displayed thumbnails 902, 904, 906 and 908, the display image associated with the selected thumbnail is requested from server 110, retrieved from DI 116, returned to UCS 100, and displayed to the user in template 402. As an alternate implementation, the saved map image could be initially displayed to the user in cropping window 800.

It will be appreciated that the sequence of steps, options, and windows described above is but one possible way of implementing the invention. More, fewer, or different steps, options, and windows could be employed depending on the number and variety of map customization options the service provider desires to provide to the user. For example, in a business card application, instead of displaying generic map area indicators in FIG. 5, the system could react to the user's request to view map backsides by automatically sending the address information entered by the user in the address fields on the front of the card to server 110 and generating custom map thumbnail images reflecting actual maps relevant to the user.

Various illustrative embodiments have been discussed, but other alternate embodiments could also be employed. Therefore, the described embodiments are to be considered as illustrative rather than restrictive and the scope of the invention is as indicated in the following claims and all equivalent methods and systems.

What is claimed is:

1. A computer-implemented method for use in creating an electronic design of a two-sided product intended for subsequent printing, the method comprising
    providing an image of at least a portion of a first side of the product for displaying to the user of a client computer for customization by the user,
    providing a tool allowing the user to supply at least text to be printed on the first side,
    providing an image of at least a portion of a second side of the product for displaying to the user for customization by the user, the second side of the product having a map area where a map will be printed when the product is printed,
    providing a tool allowing the user to identify a location to be included within the map that will be printed in the map area, making electronic map information available to a server computer system, the map information containing information covering a relatively large geographical area and being adapted to produce relatively high resolution maps, in response to information received from the client computer system identifying a location within the relatively large geographical area, obtaining a relatively high resolution user map from the map information, the user map covering a relatively small geographical area that includes at least the identified location, generating a lower resolution display map version of the user map, the display map being suitable for displaying at the client, transmitting the display map to the client for displaying to the user, receiving a description of the product design from the client, the description identifying at least a portion of the display map, and associating the identified portion of the display map with the corresponding higher resolution map information such that when the product is printed the map area on the second side of the product design will be printed using the higher resolution map information.

2. The method of claim 1 further comprising storing the obtained user map at the server.

3. The method of claim 1 further comprising providing a user-controllable crop box allowing the user to identify a desired portion of the display map.

4. The method of claim 1 further comprising generating a thumbnail version of the display map and storing the thumbnail version at the server.

5. The method of claim 4 further comprising retrieving the stored thumbnail version in response to a request from the user and transmitting the thumbnail version to the client computer system for viewing by the user.

6. The method of claim 1 wherein the user map is based on address information supplied by the user for printing on the first side of the product.

7. The method of claim 1 wherein the information received includes a zoom level to be used to obtain the user map.

8. The method of claim 1 wherein the user map is obtained from the map information at a height and width ratio that corresponds to the height to width ratio of the map area.

9. The method of claim 1 wherein the display map is generated to have a height and width ratio that corresponds to the height to width ratio of the map area.

10. A computer-implemented method for use in creating an electronic design of a product intended for subsequent printing on two sides, the method comprising displaying an image of at least a portion of one side of the product to the user of a client computer, the side of the product having a map area where a map will be printed when the product is printed, displaying a tool allowing the user to identify a location to be included within the map that will be printed in the map area, supplying information to a server computer system having access to map information covering a relatively large geographical area and adapted to produce relatively high resolution maps, the supplied information identifying at least a location within the relatively large geographical area, receiving a display map from the server, the display map covering a relatively small geographical area that includes at least the identified location and being at a relatively low resolution suitable for displaying at the user computer, displaying at least a portion of the display map such that the displayed portion of the display map is displayed to the user in the map area, and transmitting a description of the electronic product design to the server for subsequent printing of the product, the description identifying the incorporated portion of the display map such that the server can associate the received product design with a corresponding higher resolution map at the server.

11. The method of claim 10 further comprising allowing the user to supply different information to the server such that a different display map will be received.

12. The method of claim 11 wherein the different information is a different location.

13. The method of claim 11 wherein the different information is a different zoom level.

14. The method of claim 10 further comprising displaying the display map with a user-controllable crop box such that the user can vary the portion of the display map displayed in the map area.

15. The method of claim 10 further comprising
requesting a display of one or more thumbnail map images stored on the server,
selecting one of the displayed thumbnail images, and
receiving a display map associated with the selected thumbnail images from the server.

16. The method of claim 15 further comprising replacing the at least a portion of the received display map currently displayed in the map area with at least a portion of the received display map associated with a selected thumbnail image.

17. A computerized system for use in creating an electronic design of a two-sided product intended for subsequent printing, the system comprising means for providing an image of at least a portion of a first side of the product for displaying to the user of a client computer for customization by the user, means for providing a tool allowing the user to supply at least text to be printed on the first side, means for providing an image of at least a portion of a second side of the product for displaying to the user for customization by the user, the second side of the product having a map area where a map will be printed when the product is printed, means for providing a tool allowing the user to identify a location to be included within the map that will be printed in the map area, means for making electronic map information available to a server computer system, the map information containing information covering a relatively large geographical area and being adapted to produce relatively high resolution maps, means, responsive to information received from a the client computer system identifying a location within the relatively large geographical area, for obtaining a relatively high resolution user map from the map information, the user map covering a relatively small geographical area that includes at least the identified location, means for generating a lower resolution display map version of the user map, the display map being suitable for displaying at the client, means for transmitting the display map to the client for displaying to the user, means for receiving a description of the product design from the client, the description identifying at least a portion of the display map, and means for associating the identified portion of the display map with the corresponding higher resolution map information such that the product design will be printed using the higher resolution map information.

18. The system of claim 17 further comprising means for storing the obtained user map at the server.

19. The system of claim 17 further comprising means for providing a user-controllable crop box allowing the user to identify a desired portion of the display map.

20. The system of claim 17 further comprising means for generating a thumbnail version of the display map and means for storing the thumbnail version at the server.

21. The system of claim 20 further comprising means for retrieving the stored thumbnail version in response to a request from the user and means for transmitting the thumbnail version to the client computer system for viewing by the user.

22. The system of claim 17 wherein the user map is based on address information supplied by the user for printing on a different side of the product.

23. The system of claim 17 wherein the information received includes a zoom level to be used to obtain the user map.

24. The system of claim 17 wherein the user map is obtained from the map information at a height and width ratio that corresponds to the height to width ratio of the map area.

25. The system of claim 17 wherein the display map is generated to have a height and width ratio that corresponds to the height to width ratio of the map area.

26. A computer-implemented system for use in creating an electronic design of a product intended for subsequent printing, the system comprising means for displaying an image of at least a portion of one side of the product to the user of a client computer, the side of the product having a map area where a map will be printed when the product is printed, means for displaying a tool allowing the user to identify a location to be included within the map that will be printed in the map area, means for supplying information to a server computer system having access to map information covering a relatively large geographical area and adapted to produce relatively high resolution maps, the supplied information identifying at least a location within the relatively large geographical area, means for receiving a display map from the server, the display map covering a relatively small geographical area that includes at least the identified location and being at a relatively low resolution suitable for displaying at the user computer, means for displaying at least a portion of the display map such that the displayed portion of the display map is displayed to the user in the map area, and means for transmitting a description of the electronic product design to the server for subsequent printing of the product, the description identifying the incorporated portion of the display map such that the server can associate the received product design with a corresponding higher resolution map at the server.

27. The system of claim 26 further comprising allowing the user to supply different information to the server such that a different display map will be received.

28. The system of claim 27 wherein the different information is a different location.

29. The system of claim 27 wherein the different information is a different zoom level.

30. The system of claim 26 further comprising means for displaying the display map with a user-controllable crop box such that the user can vary the portion of the display map displayed in the map area.

31. The system of claim 26 further comprising means for requesting a display of one or more thumbnail map images stored on the server, means for selecting one of the displayed thumbnail images, and means for receiving a display map associated with the selected thumbnail images from the server.

32. The system of claim 31 further comprising means for replacing the at least a portion of the received display map currently displayed in the map area with at least a portion of the received display map associated with a selected thumbnail image.

* * * * *